United States Patent [19]

Viselli

[11] Patent Number: 4,629,266

[45] Date of Patent: Dec. 16, 1986

[54] ELECTRICAL DEVICE, SUCH AS AN ELECTRICAL CONNECTOR RECEPTACLE, FOR SURFACE MOUNTING ON A CIRCUIT BOARD

[75] Inventor: Michael A. Viselli, Harrisburg, Pa.

[73] Assignee: AMP Incorporated, Harrisburg, Pa.

[21] Appl. No.: 744,845

[22] Filed: Jun. 13, 1985

[51] Int. Cl.⁴ .............................................. H01R 9/09
[52] U.S. Cl. .............................................. 339/17 LC
[58] Field of Search ............... 339/17 R, 17 D, 17 C, 339/17 CF, 17 L, 17 LM, 17 M, 17 LC, 176 M, 176 MP

[56] References Cited

U.S. PATENT DOCUMENTS 3,315,217  4/1967  Bird ...................................... 339/17 R
4,470,648  9/1984  Davis et al. ........................... 339/17 CF

FOREIGN PATENT DOCUMENTS 184297   7/1966  U.S.S.R. ............................ 339/17 L
1095282  5/1984  U.S.S.R. ........................... 339/17 LC

*Primary Examiner*—Neil Abrams
*Attorney, Agent, or Firm*—F. W. Raring

[57] ABSTRACT

Electrical device, such as a connector receptacle, which is intended for mounting on the same side of a circuit board as the conductors are on comprises a housing having one surface which is opposed to the surface of the circuit board. The conductors in the device extend along the one surface of the housing and beyond an adjacent face of the housing. The end portions of the conductors extend in a zig-zag manner to a contact portion. The zig-zag compliant portions are unrestrained and can adapt themselves to slight movement of the housing without damage to the solder connections between the conductors on the circuit board and the contact portions of the conductors.

2 Claims, 8 Drawing Figures

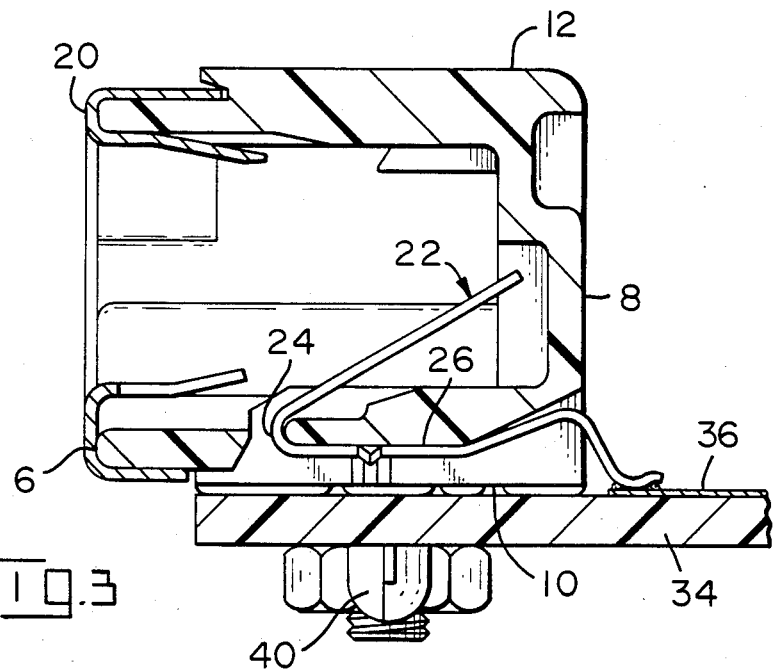
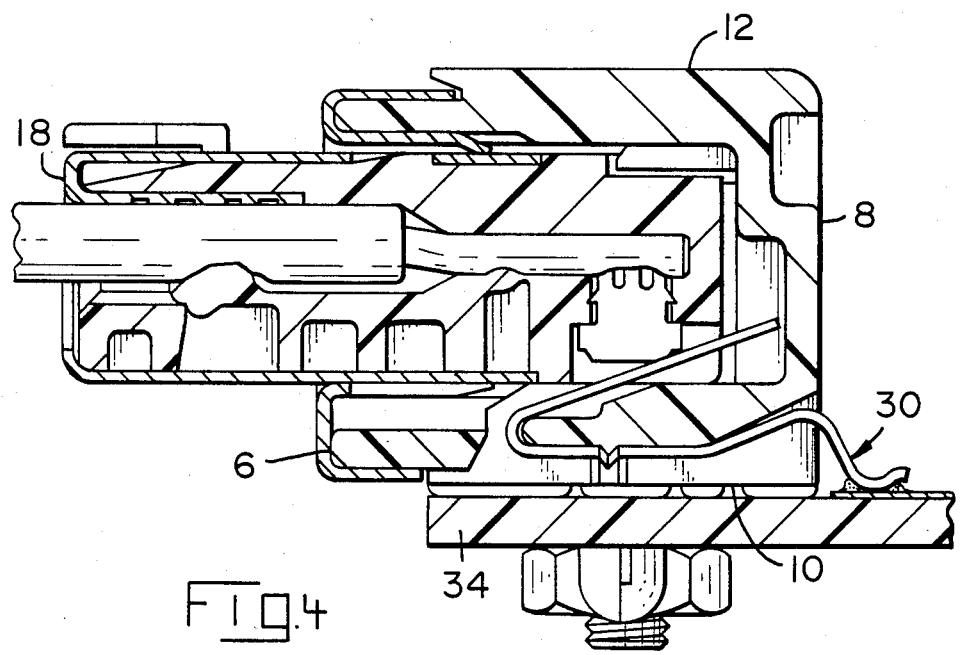

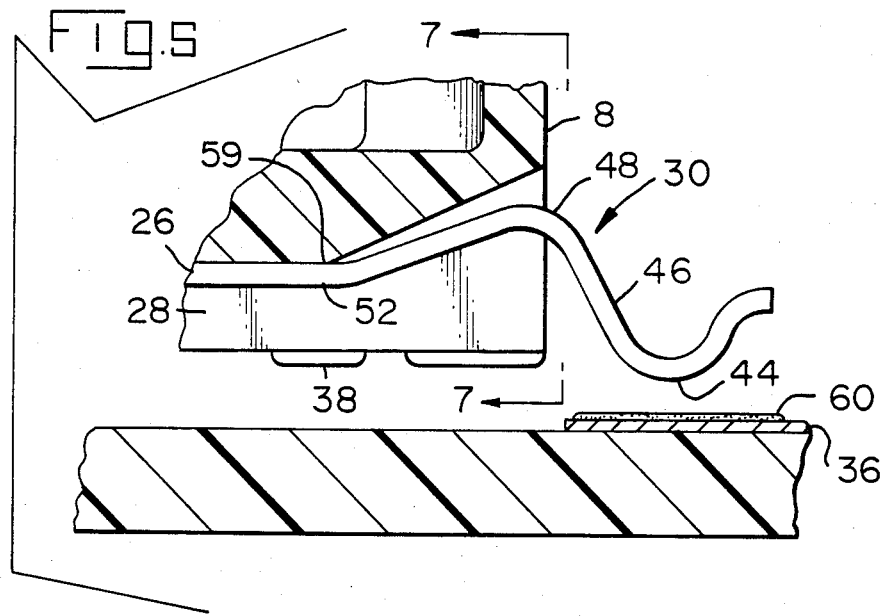
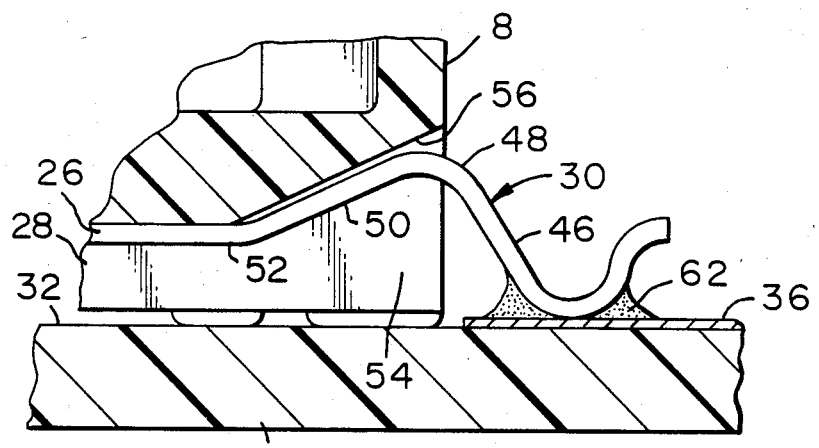
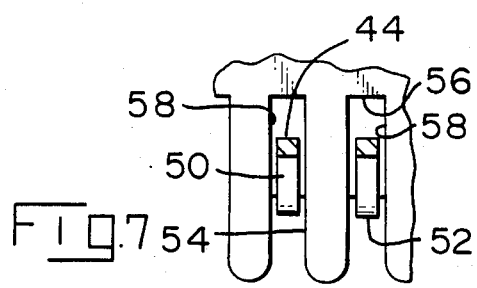

ELECTRICAL DEVICE, SUCH AS AN ELECTRICAL CONNECTOR RECEPTACLE, FOR SURFACE MOUNTING ON A CIRCUIT BOARD

FIELD OF THE INVENTION

This invention relates to electrical devices which are intended for mounting on the surface of a circuit board on which the circuit board conductors are provided. The invention is herein described with particular reference to an electrical receptacle connector, however, the principles of the invention are applicable to other devices which must be mounted on the circuit board.

BACKGROUND OF THE INVENTION

The most commonly known and widely used type of circuit board assembly comprises an insulating circuit board having electrical components mounted on a first surface thereof and having conductors on the second or oppositely facing surface of the board. Holes are provided in the board for the leads which extend from the components, when the board is manufactured, the components are assembled to the first surface so that the leads extend through the holes in the board. The ends of the leads are then soldered to the conductors on the second surface of the board. The manufacturing process by means of which such boards are produced is very forgiving in the sense that the lengths of the leads extending from the components are not critical but can vary within fairly wide limits. Furthermore, the fact that the leads extend through holes in the board provides a strain relief for the solder connections on the second surface of the board between the ends of the leads and the circuit board conductors. In other words, if the component from which the leads extend is handled by a technician, the handling of the component and the circuit board will not cause stresses which might be transmitted to the soldered connections and which might disturb these connections.

There is a trend away from the types of circuit boards discussed above and towards the use of circuit boards having both the circuit board conductors and the components on the first surface of the circuit board. The term "surface mounting" has been adopted to describe the techniques for securing and mounting components on the surface of a circuit board on which the conductors are provided and standard procedures are being developed for carrying out the assembly, mounting and solder operations.

In general, a circuit board having surface mounted components thereon is produced by metallizing the first surface of the board in those locations where the conductors are required and silk screening a solder paste on the metallized portions. The solder paste is a viscous material which, when heated, is capable of fusing and forming a solder joint. The components can be assembled to the board by simply aligning the leads extending from the components with the conductors on the board and lowering the component onto the board. Soldering is carried out by passing the board through a heating medium sufficient to cause fusion of the solder.

In the finished circuit board, the leads extending from the components simply rest on the circuit board conductors and are held on the board solely by the solder which has been fused onto the leads and the circuit board conductors. The solder, therefore, is required to serve as both a mechanical fastening and as an electrical connection. Since the conductors are quite narrow, the area of the solder joints is quite small and the joints are not very strong.

The mounting of devices which are not handled or which are not subject to stresses or strains presents no significant problems for surface mounting manufacturing methods. After a chip carrier or a transistor, for example, is mounted on a circuit board, it is virtually never touched by human hands and it is not subjected to stresses or strains other than those imposed by its own mass. The solder joints between the leads of the chip carrier or the like and the circuit board conductors are sufficient to hold the device in its position on the circuit board. However, there are other devices which are mounted on the circuit board which must be handled and which must withstand the imposition of forces from an external source. Such devices might be, for example, switches having parts which are turned or rotated when the switch condition is changed, rheostats, and electrial connector receptacles designed to receive a complimentary connector plug. Every time the plug is inserted into, or extracted from, the receptacle, forces are imposed on the connector housing and these forces will inevitably be transmitted to the solder joints unless precautions are taken to prevent such transfer.

The present invention is directed to the achievement of a solution to the problems of mounting devices by surface mounting techniques on circuit boards which devices are subject to external forces and which must be capable of withstanding stresses imposed by external forces. The invention is discussed generally with reference to an electrical connector receptacle, however, the principles of the invention can be used for other surface mounted circuit devices.

THE INVENTION

The invention comprises an electrical connector receptacle which is intended for mounting on a first circuit board surface. The receptacle comprises an insulating housing having a mating face, a rear face which is directed oppositely with respect to the mating face, oppositely facing first and second sidewalls, and oppositely facing endwalls. The first sidewall is opposed to the first circuit board surface when the receptacle is mounted on the circuit board. A plurality of conductors are contained in the housing, the conductors having intermediate portions which extend from a location adjacent to the mating face and the first sidewall towards the rear face. The intermediate portions are in side-by-side parallel relationship, and each of the conductors has an end which is located beyond and, is spaced from, the rear face. The end has a contact zone for contacting a circuit board conductor. The receptacle is characterized in that each of the conductors has a compliant spring end portion which extends from the contact zone to a location adjacent to the rear face of the housing. The spring end portion comprises a zig-zag portion extending from the contact zone towards the housing, the zig-zag portion being independent of the housing and being free to deflect. The contact zone is a bearing surface for engagement with a circuit board conductor on the first circuit board surface. The bearing surface is located beyond the plane of one sidewall of the housing.

In accordance with further embodiments, the zig-zag portions of the conductors each comprises a first leg which extends obliquely from the contact zone towards the rear face of the housing and a second leg which extends towards the plane of the first sidewall of the housing and which is integral with the intermediate portion of its associated conductor. Preferably, a plurality of side-by-side recesses are provided in the housing which extend inwardly from the first sidewall and inwardly from the rear face and each of the recesses receives at least a part of the zig-zag portion of one of the conductors.

THE DRAWING FIGURES

FIG. 3 is a sectional side view looking in the direction of the arrows 3—3 of FIG. 1 of the connector prior to its being mounted on a circuit board.

FIG. 4 is a view similar to FIG. 3 but showing the receptacle mounted on the circuit board and showing the plug coupled to the receptacle.

FIG. 5 is a fragmentary view on a greatly enlarged scale showing the compliant spring portion of one of the conductors in the receptacle, portions of the receptacle housing, and a circuit board on which the receptacle is about to be mounted.

FIG. 6 is a view similar to FIG. 5 but showing the positions of the parts after the receptacle has been mounted on the circuit board and the conductor soldered to the circuit board conductor.

FIG. 7 is a view looking in the direction of the arrows 7—7 of FIG. 5.

THE DISCLOSED EMBODIMENT

Figure 1:
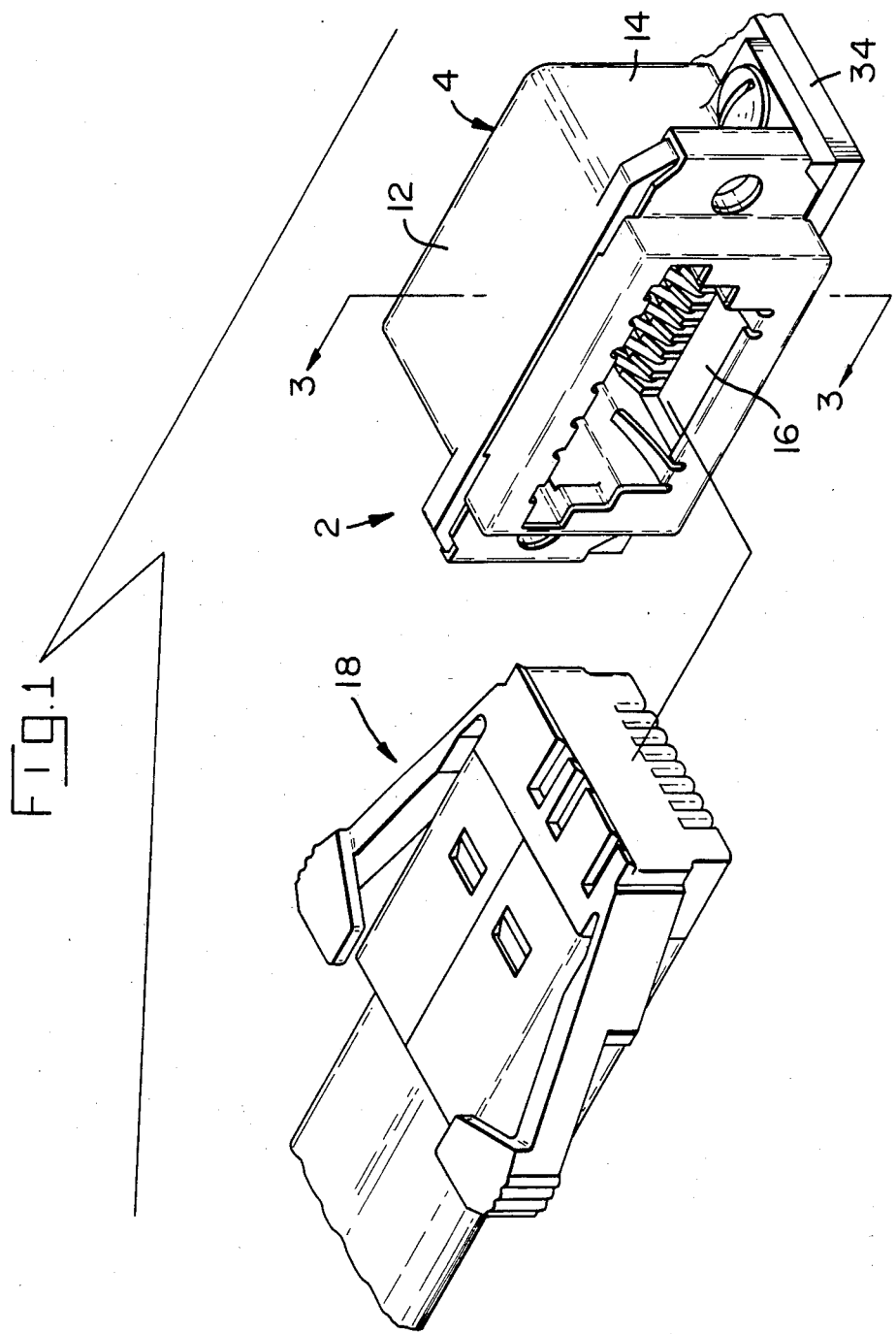
FIG. 1 is a perspective view showing the mating face of a connector receptacle in accordance with the invention and showing a plug connector which is adapted to be mated with the receptacle connector.
Figure 2:
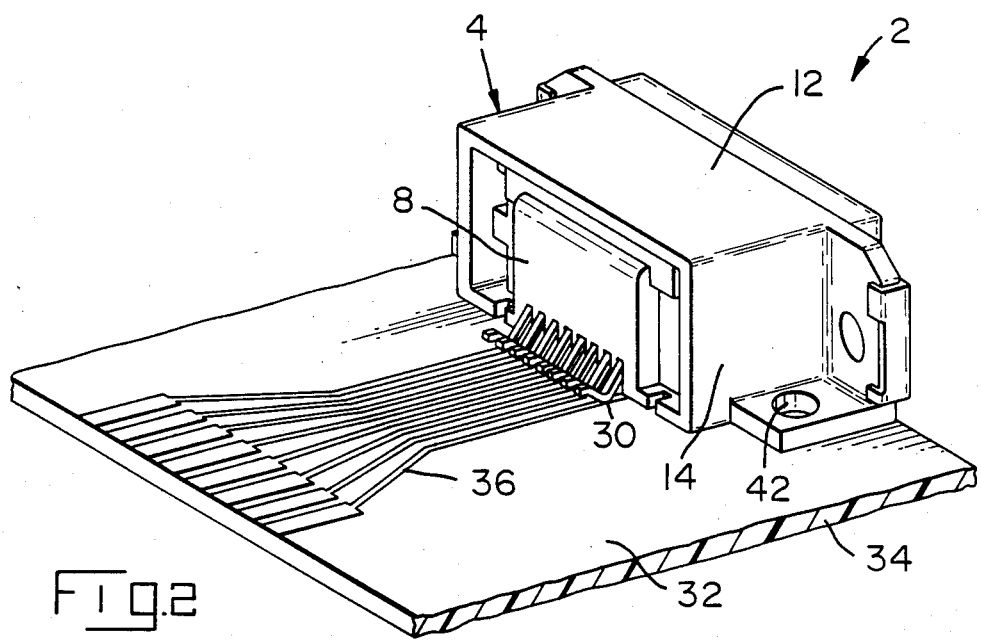
FIG. 2 is a perspective view showing the rear face of the receptacle mounted on a circuit board.

An electrical connector receptacle (2), FIGS. 1–4, in accordance with the invention comprises an insulating housing (4) having a mating force (6), a rear face (8), a first or lower sidewall (10), and a second upper sidewall (12). The sidewalls and the endwalls (14) extend from the rear face to the mating face. The mating face has a plug-receiving opening (16) extending therein which is dimensioned to receive a connector plug (18) so that contact terminals in the plug will engage the contact portions of conductors (22) mounted in the receptacle. The disclosed embodiment has a metallic shield (20) thereon which may be required under many circumstances.

The conductors (22) are of stamped and formed sheet metal and have resilient spring internal contact portions within the opening (16). The conductors extend to a location adjacent to the mating face and are reversely bent as shown at (24) so that their intermediate portions (26) extend through slots (28) in the first or lower sidewall towards. The end portions (30) of these conductors are in the form of compliant springs described in more detail below which are partially contained in the housing.

The receptacle (2) is intended to be mounted on the first or upper surface (32) of a circuit board (34) having circuit board conductors (36). The housing has standoff bosses (38) on its first sidewall (10) and has mounting posts (40) which are adapted to be inserted through openings in the circuit board to secure the receptacle to the circuit board. Additionally, and if desired, screws may be provided in holes (42) to clamp the housing to the upper surface of the circuit board or the receptacle housing might be bonded to the circuit board by an epoxy adhesive or similar material. In any event, the housing is firmly secured to the circuit board for reasons which will be discussed below.

A spherical contact zone (44) is provided on the extreme end of each conductor for engagement with a circuit board conductor (36). The compliant spring end portion is in the form of a zig-zag having a first leg (46) which extends from the contact zone to a bend (48). The second leg extends from the bend as shown at (50) and merges at (52) with the intermediate portion of the conductor. A recess (54) is provided in the housing for a portion of the zig-zag section of each conductor. The recess extends inwardly from the rear face and from the first sidewall and has an inner end (56) which extends diagonally from the associated slot (28) to the rear face of the housing. As shown in FIGS. 5 and 6, the angle of inclination of the inner end (56) is greater than the inclination of the second leg (50) of the zig-zag portion the conductor so that the second leg is spaced from the end (56) of the recess. Also, it will be noted that the lower end (59) of the inclined inner endwall (56) is spaced leftwardly in FIG. 5 from the end (52) of the zig-zag portion. This means that the entire zig-zag is free to pivot with respect to the end (52) of the zig-zag portion when the receptacle is mounted on the circuit board. Also, the width of each conductor in the zig-zag portion (30) is less than the spacing between opposed sidewalls (58) of the recesses (54) as shown in FIG. 7. By virtue of these relationships, the housing can be moved laterally, that is parallel to the plane of the circuit board (34) to a limited extent without contacting any part of the compliant end portion of each conductor.

The circuit board conductors shown in FIG. 5 have solder paste (60) thereon which is composed metallic solder and some flux material so that is is in the form of a viscous material that can be silkscreened or otherwise applied to the surfaces of the conductors on the circuit board. This material is also something of an adhesive prior to its being heated to cause fusion thereof.

In order to surface mount the receptacle (2) on the first surface (32) of the circuit board (34), the housing is moved downwardly from the position of FIG. 5 until the standoff bosses (38) are against the upper surface of the circuit board. If the connector housing has mouting posts (40) as shown, these will then be inserted into the holes in the circuit board. Also, if mounting screws are used, they will be assembled at this time as shown in FIG. 4. In any event, the housing firmly secured to the upper surface of the circuit board after it is moved downwardly onto the surface from the position of FIG. 5.

When the housing is moved downwardly onto the surface of the circuit board, the conact zone (44) will be brought against the solder paste material (60) on the circuit board conductors. As will be explained below, only an extremely low contact force is developed at the interface of the solder paste and the contact portions so that the solder paste is not plowed or pushed from the area of contact. The solder is then fused as shown at 62 to form the bond between the circuit board conductor (36) and the contact zone (44) of the conductor. An ideal bond is shown in FIG. 6 with fused solder on both sides of the contact zone (44).

The successful practice of the invention requires several critical relationships and properties in the materials used in its practice which are discussed below. For example, prior to assembly of the receptacle to the circuit board, the surfaces of the contact zones (44) must be below the plane of the first sidewall (10) of the housing so that when the housing was moved downwardly from the position of FIG. 5, the contact zones will, in fact, be against the solder paste on the circuit board conductor. There will be, therefore, some deflection in the compliant end portion of the conductor when the housing is moved from the position of FIG. 5 to the position of FIG. 6 and since the connector contains a plurality of contacts, the amount of movement of each will not be precisely the same. There must be, therefore, sufficient tolerance to permit manufacture of the housing as a practical matter so that the contact portions will all be below the plane of the first sidewall.

Figure 8:
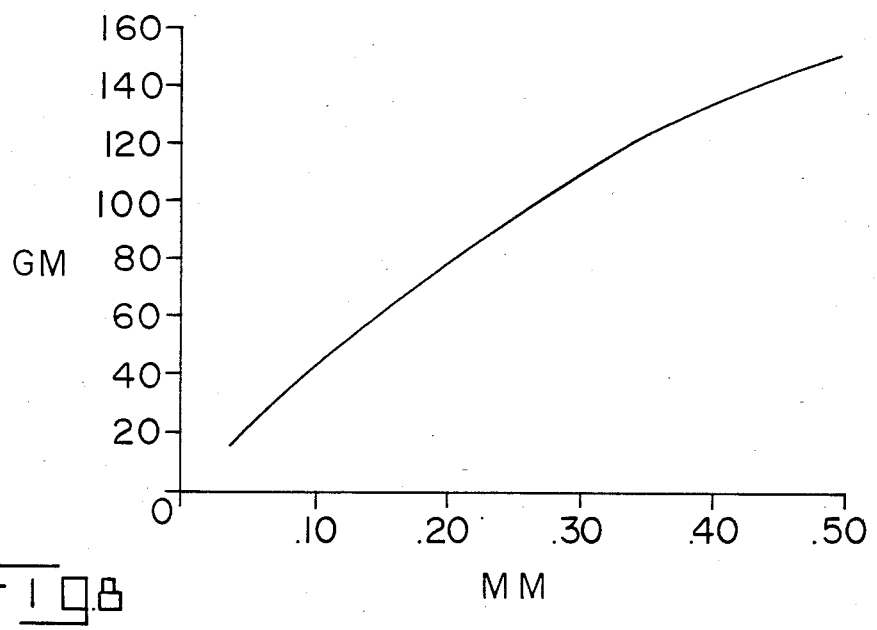
FIG. 8 is a force-deflection curve for the compliant spring portion of one of the conductors; this curve is not based on actual test data but was produced by a computer from a computer analysis of the material used in the manufacture of the conductor.

A further requirement for successful practice of the invention be that the load-deflection curve for the compliant end portions of the conductors cause only an extremely low contact force when the contact portions (44) are urged against the circuit board conductors. FIG. 8 shows a force-deflection curve for loeryllium copper conductors having a nominal width of 0.5 mm. and a thickness of 0.36 mm. and portioned substantially as shown in the drawing. This curve, incidentally, was not produced from actual test data but was plotted by computer from data generated from theoretical considerations of the material and from the dimensions. It can be seen that for a deflection of the zig-zag compliant portion of 0.20 mm., a contact force of only 80 grams will be developed. As a practical matter, and if good design practice is followed, the connector can be designed such that the contact zones on the ends of the zig-zag portions will move no more than about 0.12 mm. and the maximum contact force developed will be only about 50 grams. The invention thus permits the manufacture of connectors which will insure that all of the contact areas will be brought into engagement with the circuit board conductors and that the contact force imposed by the conductors will be extremely low, of the order of 40 to 60 grams per conductor.

The maintenance of a low contact force is essential in order to counteract the tendency of the individual conductors to push the connector from the surface of the circuit board since the contact end portions of the conductor are bearing downwardly against the surface of the board. A low contact force is also desirable in order to insure that the contact zones, when they move against the solder paste (60) do not plow or move the solder paste away from the zone in which the contact zone will be bonded to the conductor. Obviously, an extremely narrow range of deflection of the end portion of the conductor is also necessary to achieve this end.

After the receptacle has been mounted on the circuit board (34), the zig-zag compliant portion (30) provides a buffer which isolates the solder connection (62) between the contact portion (44) and the circuit board conductor from the connector housing. The buffer is highly important for the reason that during the life of a circuit board on which the receptacle is mounted, the plug member will be repeatedly inserted into and removed from the receptacle. Every time the plug is inserted or removed, forces are transmitted to the housing by the operator and these forces in turn can be transmitted to the solder joints. The zig-zag compliant portions of the conductors, however, effectively isolate the solder joints from the housing itself and any forces applied to the housing. By virtue of the fact that the zig-zag portions are completely free and unrestrained, they can also absorb lateral forces, that is forces parallel to the surface of the circuit board.

An important structural feature of the invention resides in the provision of the zig-zag compliant portion (30) in combination with the oversized recesses (5A). The compliant portions (30) are relatively long, a feature which in itself makes them compliant (i.e., having the ability to deflect without the development of high stresses or a high contact force at the contact zone (44).

The zig-zag feature enhances the compliancy of these portions. The oversized recesses (54) permit the soldered joints (62) be spaced from the connector housing but very close to the housing. The joints can then be inspected and the connector, including the leg (46), requires a minimum amount of space on the circuit board.

I claim:

1. An electrical connector receptacle or the like which is intended for mounting on a first circuit board surface, the receptacle comprising an insulating housing having a mating face, a rear face which is directed oppositely with respect to the mating face, oppositely facing first and second sidewalls and oppositely facing endwalls which extend from the mating face to the rear face, the first sidewall being opposed to the first circuit board surface when the receptacle is mounted on the circuit board, a plurality of conductors in the housing, the conductors having intermediate portions which extend from a location adjacent to the mating face and the first sidewall towards the rear face, the intermediate portions being in side-by-side parallel relationship, each of the conductors having one end which is beyond, and spaced from, the rear face, the one end having a contact zone thereon for contacting a circuit board conductor, the receptacle being characterized in that:

each of the conductors has a compliant spring end portion which extends from the contact zone to a location adjacent to the rear face of the housing, the spring end portion comprising a zig-zag portion extending from the contact zone towards the housing, the zig-zag portion being out of contact with the housing and being free for deflection, each of the zig-zag portions comprising a first leg which extends obliquely from the contact zone towards the rear face of the housing and a second leg which extends from the first leg towards the plane of the first sidewall of the housing, the housing having a plurality of side-by-side recesses therein which extend inwardly from the first sidewall and inwardly from the rear face, the second leg of each zig-zag portion being within one of the recesses, the first leg of each zig-zag portion extending beyond the rear face, each recess having an inner end which extends obliquely from the rear face to the first sidewall, the second legs of the zig-zag portions being spaced from the inner ends of the recesses, the contact zone being a bearing surface for engagement with a circuit board conductor on the first circuit board surface, the bearing surface being located beyond the plane of the first sidewall of the housing whereby, upon mounting the connector receptacle on a first concuit board surface and securing the receptacle to the circuit board, the bearing surfaces will be moved substantially to the plane of the first sidewall with minimal contact force being developed between the bearing surfaces and the circuit board conductors and after mounting and soldering of the bearing surfaces to circuit boards conductors, the zig-zag portions will serve as compliant springs which connect the contact zones of the conductors to the intermediate portions of the conductors.

2. An electrical connector receptacle as set forth in claim 1, the receptacle being mounted on a circuit board and the housing being secured to the circuit board, the contact zones being soldered to circuit board conductors.

* * * * *